United States Patent [19]
Arakawa

[11] Patent Number: 5,291,043
[45] Date of Patent: Mar. 1, 1994

[54] SEMICONDUCTOR INTEGRATED CIRCUIT DEVICE HAVING GATE ARRAY

[75] Inventor: Takahiko Arakawa, Hyogo, Japan

[73] Assignee: Mitsubishi Denki Kabushiki Kaisha, Tokyo, Japan

[21] Appl. No.: 879,103

[22] Filed: May 4, 1992

Related U.S. Application Data

[63] Continuation of Ser. No. 648,484, Jan. 31, 1991, abandoned.

[30] Foreign Application Priority Data

Feb. 7, 1990 [JP] Japan ............................ 2-29125

[51] Int. Cl.$^5$ .................... H01L 27/02; H01L 27/10
[52] U.S. Cl. ................................ 257/208; 257/202; 257/203; 257/207; 257/210; 257/211
[58] Field of Search ............... 257/202, 203, 207, 208, 257/210, 211

[56] References Cited

U.S. PATENT DOCUMENTS

| | | | |
|---|---|---|---|
| 4,595,940 | 6/1986 | Gandini et al. | 357/42 |
| 4,769,558 | 9/1988 | Bach | 307/269 |
| 4,811,073 | 3/1989 | Kitamura et al. | |
| 4,827,368 | 5/1989 | Suzuki et al. | |
| 4,883,980 | 11/1989 | Morimoto et al. | |

FOREIGN PATENT DOCUMENTS 1-41032 9/1989 Japan .

OTHER PUBLICATIONS

Charles Ng, "A Hierarchical Floor-Planning, Placement, and Routing Tool for Sea-of Gates Designs" IEEE 1989 Custom Integrated Circuits Conference pp. 3.3.1–3.3.4.

*Primary Examiner*—J. Carroll
*Attorney, Agent, or Firm*—Lowe, Price, LeBlanc & Becker

[57] ABSTRACT

A gate array semiconductor integrated circuit device allowing less clock skews is disclosed. The device includes a clock signal driver formed in the part under a power supply interconnection for input-output buffer in a power supply pin region or a ground pin region. The clock signal driver is formed in the power supply pin region and so on which, conventionally, was not utilized, so that the clock signal driver can be large enough to provide a clock signal to each basic cell column. Therefore, the input-output buffer region is not unduly occupied by the clock signal driver, and the connecting pads do not become useless.

23 Claims, 8 Drawing Sheets

SEMICONDUCTOR INTEGRATED CIRCUIT DEVICE HAVING GATE ARRAY

This application is a continuation of application Ser. No. 07/648,484 filed Jan. 31, 1991 abandoned.

BACKGROUND OF THE INVENTION

1. Field of the Invention

The invention relates generally to semiconductor integrated circuit devices having gate arrays and, more particularly, it relates to layouts of semiconductor integrated circuit devices having less clock skews and noises.

2. Description of the Background Art

With recent advancement of industrial use of a semiconductor integrated circuit device, the needs for each user have been diversified. The life cycle of a product has also been shortened. For that reason, there is an increasing need for designing a circuit free of defect in a short period of time for product development, and then manufacturing the product with less cost of development. Integration of a semiconductor integrated circuit device has also made remarkable advances. While the number of devices included in one chip has been greatly increased, it is becoming very difficult to make up a circuit utilizing them in accordance with the needs for each user. This conflicts with the need of the above-mentioned shorter period of time for development and the reduction in the cost of development.

In order to meet these needs, a semiconductor integrated circuit device including a gate array has been adopted. A gate array is an integrated circuit device including an array of basic cells arranged regularly on a semiconductor substrate. A basic cell is an assembly of devices required for constituting some function. A desired logic circuit may be obtained by combining basic cells into one unit. A gate array is an integrated circuit device which includes an arrangement of basic cells, in which an interconnection for connecting the basic cells has not been formed yet.

FIG. 1 is a typical diagram of a gate array semiconductor integrated circuit device. Referring to FIG. 1, the chip 26 of this semiconductor integrated circuit device includes basic cell columns 28 provided near the center of the surface, having basic cells arranged regularly, an interconnection region 29 provided around the basic cell columns 28, in which later an interconnection is formed for connecting the basic cells to the basic cells and to an input-output buffer which will be described later, an input-output buffer region 27 provided around the interconnection region 29, in which are formed transistors and the like required for forming a circuit for effecting input and output between the basic cell columns and an external circuit, and a pad forming region 35 around the input-output buffer region 27, in which are formed connecting pads 30 for connecting this semiconductor chip 26 with the external circuit, a power supply pad 61 to which an external power supply is connected, and a ground pad 62 to which a ground potential is connected.

Referring to FIGS. 2, 4, and 5, a basic cell 48 included in the basic cell column 28 includes, for example, p channel MOS (Metal-Oxide Semiconductor) transistors 82, 83 formed on an n-type silicon semiconductor substrate 71, and two n channel transistors 84, 85 formed on a P-type well 72 formed on the main surface of the silicon substrate 71.

Referring to FIG. 4, the p channel transistor 82 includes two p+ diffusion regions 73, 74 formed on the surface of the semiconductor substrate 71 with a prescribed spacing therebetween, a gate oxide film formed on the main surface of the semiconductor substrate 71 between the p+ diffusion regions 73, 74, and a polysilicon layer 79 formed on the gate oxide film.

The pMOS 83 includes a p+ diffusion layer 74, a p+ diffusion layer 75 formed, spaced apart from the p+ diffusion layer 74, a gate oxide film formed on the main surface of the semiconductor substrate 71 between the p+ diffusion layers 74, 75, and a polysilicon layer 80 formed on the gate oxide film.

Referring to FIG. 5, the nMOS 84 includes n+ diffusion layers 76, 77 formed on a p-type well 72 and spaced from each other between a gate oxide film formed on the surface of the p-type well 72 between the n+ diffusion layers 76, 77, and a polysilicon layer 79 formed on the gate oxide film.

The nMOS 85 includes an n+ diffusion layer 77, an n+ diffusion layer 78 formed on the p-type well 72, and spaced apart from the n+ diffusion layer 77, a gate oxide film formed on the surface of the p-type well 72 between the n+ diffusion layers 77, 78, and a polysilicon layer 80 formed on the gate oxide film.

A silicon oxide film 81 is formed on the pMOSs 82, 83, and the nMOSs 84, 85. The polysilicon layer 79 of the pMOS transistor 82 and the polysilicon layer 79 of the nMOS transistor 84 are common, forming a gate electrode of each transistor. Similarly, the polysilicon layer 80 of the pMOS transistor 83 and the polysilicon layer 80 of the nMOS transistor 85 are common, forming a gate electrode of each transistor.

The gate array semiconductor integrated circuit device includes a multiplicity of basic cells 48 (FIG. 2) as stated above, arranged regularly in the basic cell columns 28. A transistor group, as stated above, used as an input-output buffer is also formed in advance in the input-output buffer region 27. There is no interconnection for connecting each of these transistors. That is, it can be said that the gate array chip 26 shown in FIG. 1 is an incomplete semiconductor integrated circuit device.

FIG. 6 is a typical diagram showing the process in manufacturing a semiconductor integrated circuit device for each user with use of a gate array chip. Referring to FIG. 6, at first, a process called master design is conducted in which a layout of the gate array chip as shown in FIG. 1 is designed. As a result of the master design, a master mask 87 is obtained. A master slicer 86 is obtained by diffusing impurities on the semiconductor substrate with use of the master mask 87, and forming a polysilicon layer. A plurality of gate array chips as shown in FIG. 1 are formed on the master slicer 86. The manufactured master slicers 86 are stocked.

In manufacturing a new semiconductor integrated circuit device in accordance with a demand of a user, firstly, a circuit which agrees with the users need is designed. Basic circuits, for example, different kinds of logic gates and flipflops are designed in advance, using basic cells, and the result is registered in a library. In accordance with a circuit design for each user, an interconnection for implementing the circuit required by the user on the master slicer 86 is automatically calculated and determined by a computer. This is called an automatic layout interconnection. As a result of the automatic layout interconnection, personalized masks 88, 89 are formed in which an interconnection pattern to be added to the master slicer 86 is only recorded in order to implement an integrated circuit for each user. This process is called a "personalization". The personalized masks 88, 89 accordingly differ in accordance with the need of the customer.

An interconnection is formed on the master slicer 86 with metal and so on in accordance with the personalized masks 88, 89. The semiconductor integrated circuit on which an interconnection is formed is assembled with peripheral circuits, subjected to a final test, and forwarded to the user.

That is, a semiconductor integrated circuit device with use of a gate array may be obtained by stocking a master slicers having a specific arrangement of basic cells as a semi-finished product, and processing it in accordance with the need of each user. Accordingly, a gate array has advantages below.

Firstly, less cost is required for developing a final product. It takes less than in the case in which a specific design is conducted from the beginning for each user because a master slicer common to all the users is used. The time period required for developing a final product is shorter because it is required only to determine what kind of interconnection should be formed on the master slicer. It is possible to effect an automatic layout interconnection by the computer to the gate array with use of a library as stated above, therefore allowing the semiconductor integrated circuit device with a gate array to be developed without error and in a short period of time. Additionally, for example, in developing a large scale computer, it is necessary to make a large number of chips including a multiplicity of gates. In this case, a gate array is suitable because it can be manufactured at a low cost, and a debugging is readily conducted.

As stated above, a gate array is becoming very important in developing a semiconductor integrated circuit device. With improvement in integration of an integrated circuit, however, the number of flipflops or latches included in a gate array is increased. It is also necessary to meet the need that the device should be operated at a high speed. For that, it is necessary to make a skew as small as possible which occurs in a clock signal provided to a flipflop included in each basic cell. A skew is a deviation of the timing of a clock signal supplied to each flipflop.

Consider the case in which pulses 90a, 90b of a clock signal supplied to flipflops at two different points do not deviate from each other in time as shown in FIGS. 7 (a) and (b). The time period T1 is long enough for the cycle time for operating the system. However, as shown in FIGS. 8 (a), (b), considering the case in which a large skew occurs to the pulses 90a, 90b of the clock signal supplied to different flipflops, the cycle time should be made longer, such as T2. Otherwise, the state of each flipflop included in the semiconductor integrated circuit device becomes disordered. That is, when there is a skew, an operating speed of a semiconductor integrated circuit device is not increased. Even if integration of the semiconductor integrated circuit device is increased, its operating speed remains the same.

Accordingly, there has been proposed a method in which a skew is controlled by distributing the clock signal to a plurality of drivers. FIG. 9 is a plan view of a chip 26 of a gate array semiconductor integrated circuit device in which such a method is adopted. Referring to FIG. 9, the chip 26, as well as the gate array semiconductor integrated circuit device shown in FIG. 1, includes basic cell columns 28, an interconnection region 29 provided around the basic cell columns 28, an input-output region 27 provided around the interconnection region 29, and a pad forming region around the input-output region 27, along the outer periphery of the chip 26.

In a part of the input-output buffer region 27, there is provided a clock signal driver 33 connected to one clock input pad 32 formed in the pad forming region 35 for providing a clock signal to the basic cell columns 28 with a sufficient drive capability. In each basic cell column 28 are formed one or a plurality of subdrivers 31 for distributing and providing a clock signal supplied through a clock signal interconnection 34 from the clock signal driver 33, to flipflops in each basic cell column 28 through a clock signal interconnection 36.

In the pad forming region 35, there are formed, in addition to the clock signal input pad 32, signal bonding pads 30 arranged regularly, a pad 61 for power supply to which an external power supply provided to the chip 26 is connected, and a grounding pad 62 to which a circuit in the chip 26 is connected. The pad forming region 35 adjoining the pad for power supply 61, and the input-output buffer region form a power supply pin region 63. Part of the pad forming region 35 adjoining the grounding pad 62 and part of the input-output region 27 form a ground pin region 64.

FIG. 10 is an enlarged plan view of a region 65 including the power supply pin region 63 and the ground pin region 64 shown in FIG. 9. Referring to FIG. 10, in the input-output buffer region, there are formed a power supply interconnection 37 for output buffer connected to the pad 61 for providing the power supply to the output buffer, a ground interconnection 38 for output buffer connected to the grounding pad 62 for connecting each output buffer with an external ground potential, a power supply interconnection 39 for providing the power supply to an input buffer and a prebuffer, and a ground interconnection 40 for connecting the input buffer and the prebuffer with an external ground potential.

In a lower portion of the power supply interconnection 37 for output buffer in the input-output buffer region 27 except the region of the power supply pin region 63 and the ground pin region 64, pMOS transistors 41 for output buffer are formed. Similarly, in the lower portion of the ground interconnection 38 for output buffer, nMOS transistors 42 for output buffer are formed. In the lower portion of the power supply interconnection 39 for input buffer and prebuffer, pMOS transistors 43 for input buffer and prebuffer are formed. In the lower portion of the ground interconnection 40 for input buffer and prebuffer, nMOS transistors 44 for input buffer and prebuffer are formed. The source of the pMOS transistor 41 is connected to the interconnection 37. The source of the pMOS transistor 43 is connected to the interconnection 39. The source of the nMOS transistor 42 is connected to the interconnection 38. The source of the nMOS transistor 44 is connected to the interconnection 40.

In the input-output buffer region 27 adjoining the pad 30 for connection, an input-output cell 91 as shown in FIG. 11 is formed by transistors 41 to 44 shown in FIG. 10.

Referring to FIG. 11, the input-output cell 91 includes an output buffer 92 formed by the transistors 41, 42 and so on, and a diode 94. They are not connected to each other. The input-output cell 91 further includes an input buffer 93 formed by the transistors 43, 44 and so on and a diode 95. They are not connected to each other, either.

Referring to FIG. 12, in the process of personalization, if the input-output cell 91 is used as an output buffer, the output buffer 92 and a logic circuit inside of the chip are connected to each other. The output of the output buffer 92, the input of the diode 94 and the bonding pad for connection 30 are connected together. In this case, the input buffer 93 is not used. Conversely, when the input-output cell 91 is used as an input buffer, the input buffer 93 is connected to the bonding pad 30 and to the internal logic circuit.

The gate array semiconductor integrated circuit devices shown in FIGS. 9 to 12 operate as follows after being personalized. The clock signal driver 33 provides a clock signal externally applied over the clock signal input pad 32, to a subdriver 31 over the interconnection 34 with a sufficient drive capability. The subdriver 31 provides the supplied clock signal to each flipflop in the basic cell columns 28 with a sufficient drive capability. Each flipflop in the basic cell columns 28 operates as a logic circuit formed as a result of personalization.

Among the input-output cells 91 provided in connection with each bonding pad 30 for connection, ones that operate as a buffer for input supply the information externally applied through the bonding pad 30 to the flipflop of each logic circuit within the basic cell columns 28. Among the input-output cells 91, ones personalized as an output buffer supply the outputs of the flipflops of the logic circuit within the basic cell columns 28 to an external circuit through the bonding pad 30 for connection. At this time, each flipflop operates synchronizing with a clock signal applied from the clock signal input pad 32.

FIG. 13 is a plan view of a chip of another example of a conventional semiconductor integrated circuit device in which a specific method is adopted in order to control a clock skew. In FIGS. 9 and 13, the same or the corresponding portions are given the same reference designations and names. Their functions are also the same. Accordingly, a detailed description thereof will not be repeated here.

The semiconductor integrated circuit device shown in FIG. 13 is different from the device shown in FIG. 9 in that it includes, in place of the clock signal driver 33 and the subdrivers 31, a clock signal driver 46 connected to a clock signal input pad 45, and formed within the input-output buffer 27 for providing a clock signal collectively over each clock signal interconnection 47 to each flipflop in the basic cell columns 28.

The chip 26 of the semiconductor integrated circuit device shown in FIG. 13 operates as follows after the processes of personalization. A clock signal is externally applied to the clock signal driver 46 over the clock signal input pad 45. The clock signal driver 46 distributes and provides the clock signal to each flipflop through the clock signal interconnection 47 with a sufficient drive capability.

It should be noted that the clock driver 46 is formed in the region other than the power supply pin region 63 or the ground pin region 64.

The conventional semiconductor integrated circuit device, however, has disadvantages as follows. Firstly, in the case of the semiconductor integrated circuit device shown in FIG. 9, there is a possibility that the performance of each subdriver 31 varies. For that reason, it is possible that there will be a skew in a clock signal supplied from each subdriver 31. As long as the processes of the automatic layout interconnection is effected, using a CAD in the process of personalization, it is difficult to make the same the distances of interconnection between the clock signal driver 33 and each subdriver 31, and to make the same the distances between each subdriver 31 and each flipflop. Accordingly, there is a possibility that a skew due to the difference in the length of interconnection may occur in the clock signal. When each subdriver operates, there may be fluctuation in the ground potential. This fluctuation adversely affects the logic circuit as a noise.

In the semiconductor integrated circuit device shown in FIG. 13, there is a problem that the drive capability of the clock signal driver 46 must be increased as the number of gates included in the device becomes larger. For that, it is necessary to form a large clock signal driver in the input-output buffer region 27, which reduces the number of input-output buffers which may be utilized, and the number of the usable input-output pins. In accordance with Rent's law shown in FIG. 14, as the number of gates included in the gate array becomes large, the number of pins to be provided in the chip is increased. Accordingly, it is necessary to ensure as many usable pins as possible in order to increase integration of the semiconductor integrated circuit device. The use of the large clock signal driver 46 as stated above prevents the improvement in integration of a semiconductor integrated circuit device.

If the gate array is adapted for more purposes, the number of unit cells included therein becomes larger, and the number of devices used as input-output buffer is also increased. A larger area of the chip is also required for the input-output buffer. The use of a large clock signal driver prevents the gate array from being adapted to the wider range of purposes.

Furthermore, as shown in FIG. 13, when the clock signal driver and the ground pin are apart from each other, the inductance therebetween is increased. For that reason, it is possible that the noise appearing on the ground potential is increased. That is, in the case of the semiconductor integrated circuit device shown in FIG. 13, while the skew which occurs in the clock is reduced, the improvement in the performance of the semiconductor integrated circuit device is prevented.

SUMMARY OF THE INVENTION

The object of the invention is, therefore, to provide a gate array semiconductor integrated circuit device capable of controlling the occurrence of a clock skew and the effect of noises, which does not reduce the number of pins of input and output.

The semiconductor integrated circuit device in accordance with the invention includes a semiconductor substrate having a main surface. The main surface is divided into a first region in the central portion, a second portion along the outer edge of the semiconductor substrate, and a third region between the first region and the second region. The semiconductor integrated circuit device further includes a basic cell array including a plurality of basic cells formed on the main surface in the first region. Each basic cell includes a plurality of active elements. The semiconductor integrated circuit device further includes a plurality of connecting pads provided in the second region for connecting the semiconductor integrated circuit device with the outside, a clock signal driver formed in the third region adjoining one of first connecting pads included in the connecting pads, to be connected to the connecting pad selected as a clock signal input pad included in the connecting pads for providing a clock signal externally applied over the clock signal input pad to each basic cell, and a plurality of input-output interface circuits formed in the third region for interfacing the basic cell array and the outside portion. Each interface circuit includes an output buffer circuit for supplying one of the outputs of the basic cell array to the outside over one of the connecting pads, and an input buffer circuit for supplying a signal externally applied over one of the connecting pads to the basic cell array. The semiconductor integrated circuit device in accordance with the invention further includes an interconnection formed in the third region, stacked on the clock signal driver and the input-output interface circuit for providing a predetermined pair of voltages to the input-output interface circuit. The interconnection includes a first pair of interconnections connected respectively to a first pair of connecting pads on the clock signal driver for providing a pair of voltages externally applied over the first pair of connecting pads to the output buffer circuit.

In the semiconductor integrated circuit device having the above-mentioned structure, in the portion directly under the region where the connecting pad externally provided with a voltage and a pair of interconnections for providing this voltage to the output buffer circuit are connected, a clock signal driver is formed. Conventionally, this portion was not used, so that a sufficiently large clock signal driver can be formed without reducing the number of input-output buffer circuits. Therefore, it is possible to provide a clock signal free of a skew from the clock signal driver to each basic cell without using a subdriver.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
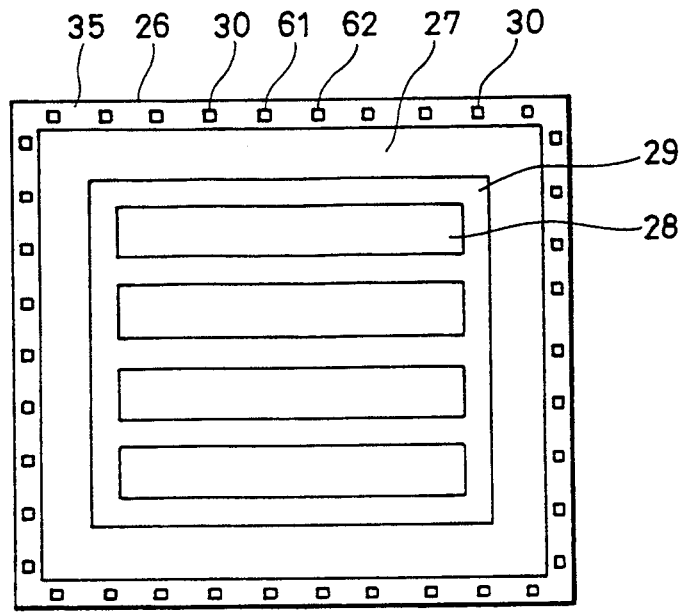
FIG. 1 is a typical plan view of a gate array chip.
Figure 2:
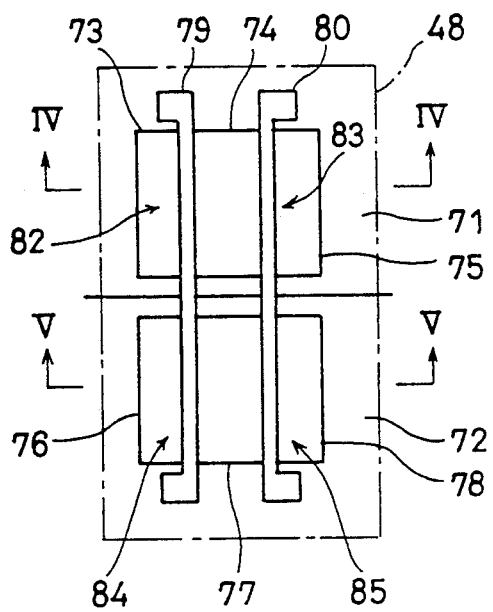
FIG. 2 is a typical plan view of a basic cell.
Figure 3:
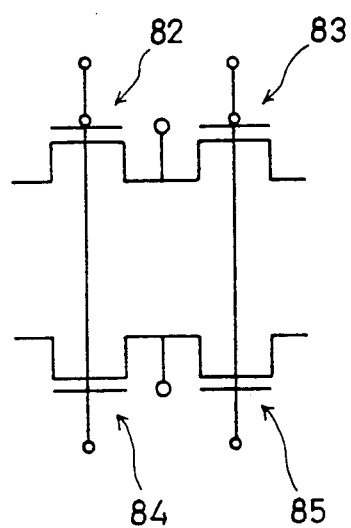
FIG. 3 is an equivalent circuit diagram of the basic cell shown in FIG. 2.
Figure 4:
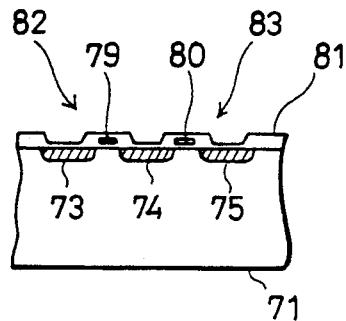
FIG. 4 is a cross-sectional view taken in the direction of the arrows IV—IV in FIG. 2.
Figure 5:
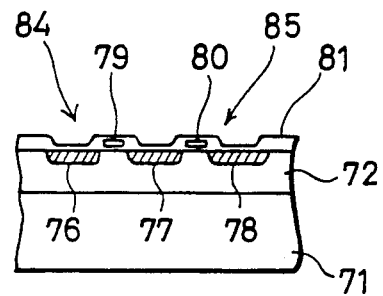
FIG. 5 is a cross-sectional view taken in the direction of the arrows V—V in FIG. 2.
Figure 6:
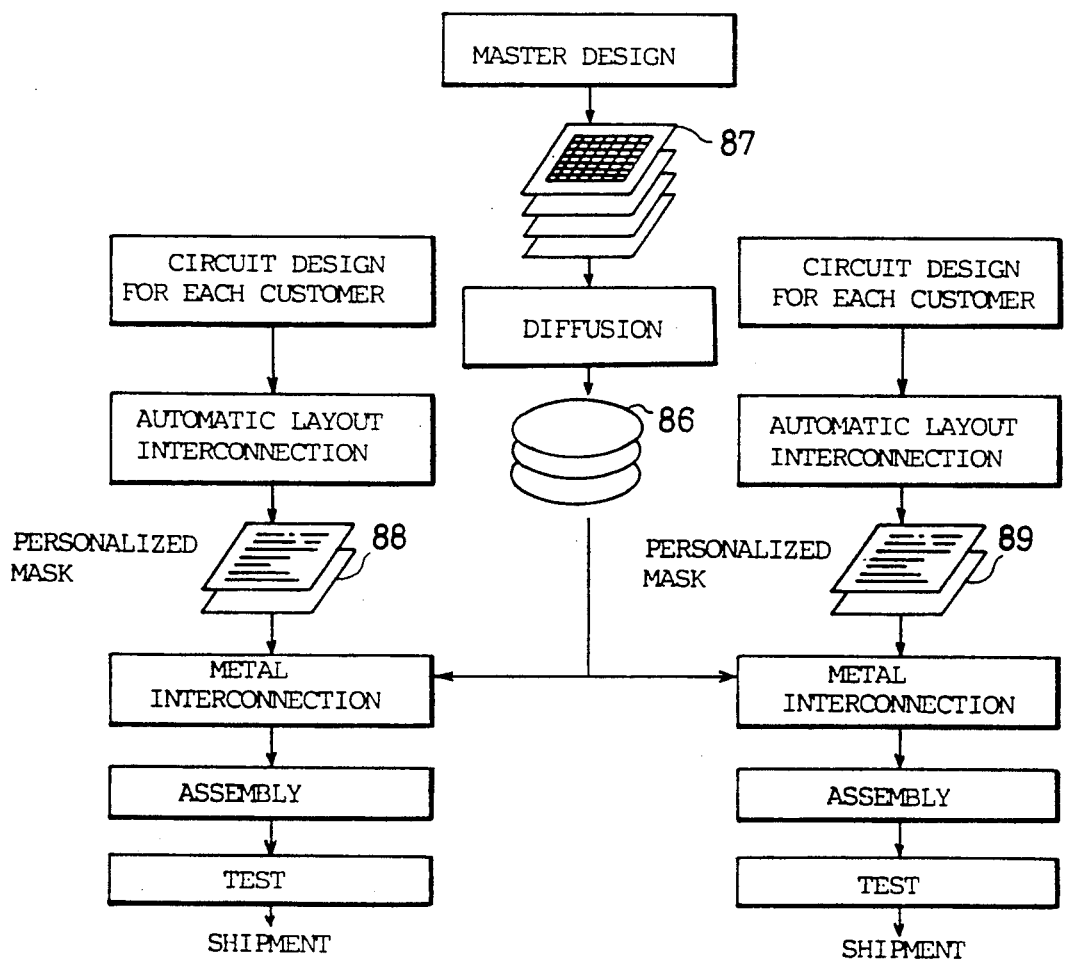
FIG. 6 is a typical diagram showing a manufacturing process of a semiconductor integrated circuit device using a gate array.
Figure 7:
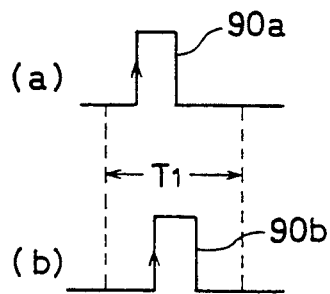
FIGS. 7 and 8 are typical waveform diagrams of a clock signal.
Figure 8:
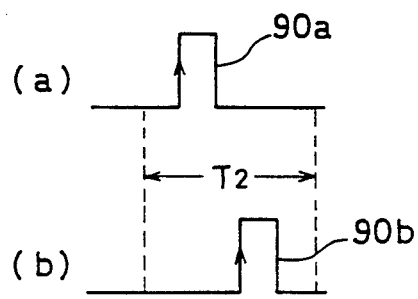
Figure 9:
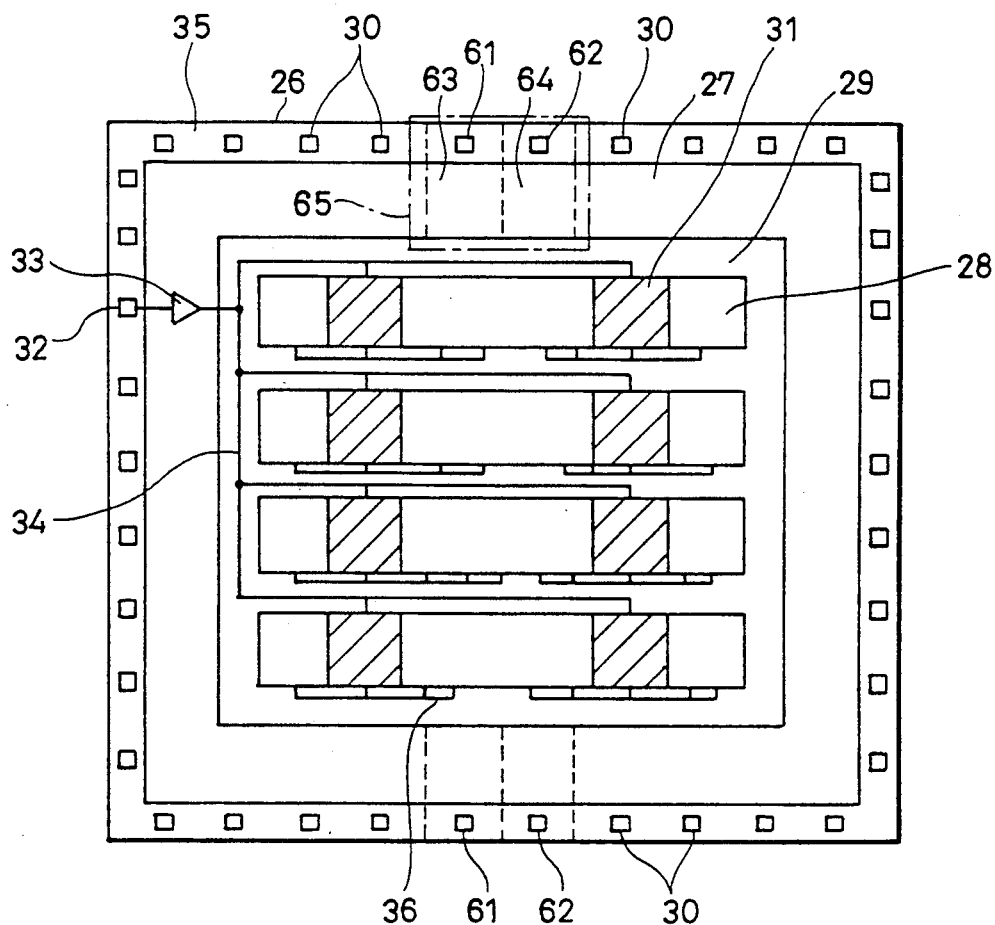
FIG. 9 is a plan view of a conventional gate array semiconductor integrated circuit device.
Figure 10:
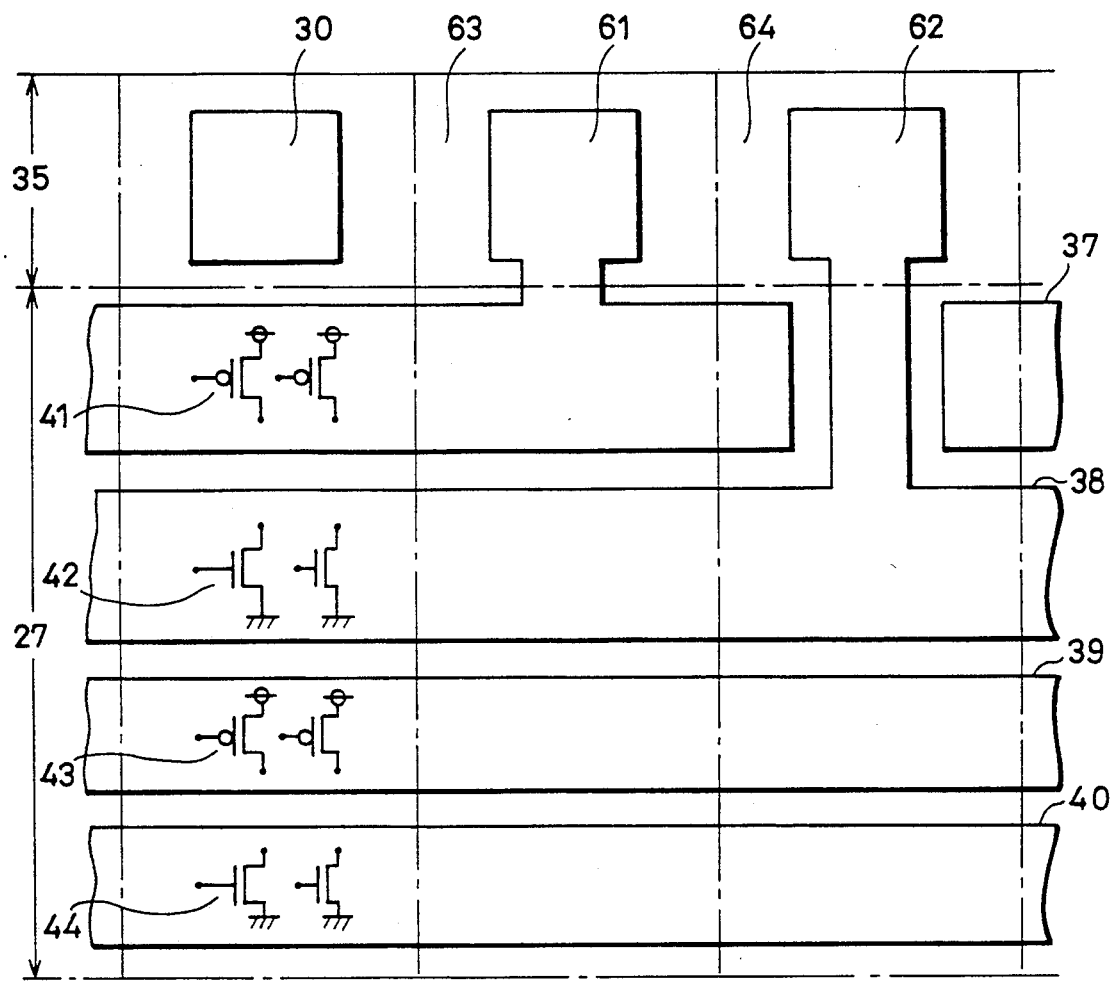
FIG. 10 is a partly enlarged view of FIG. 9.
Figure 11:
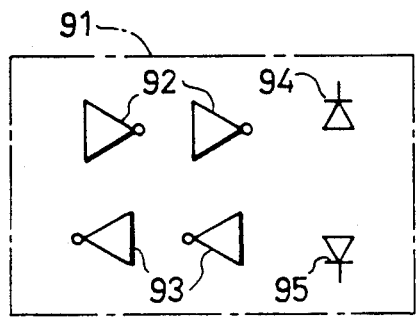
FIG. 11 is a typical circuit diagram of an input-output buffer circuit in which interconnection has not been effected yet.
Figure 12:
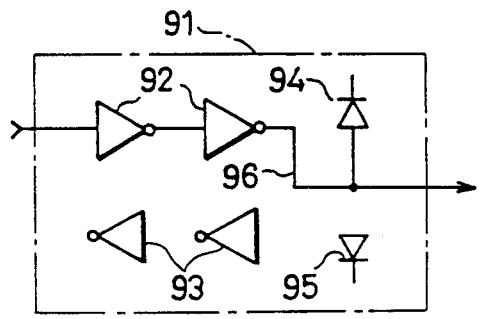
FIG. 12 is a circuit diagram of an input-output buffer circuit in which interconnection has been effected as an output buffer circuit.
Figure 13:
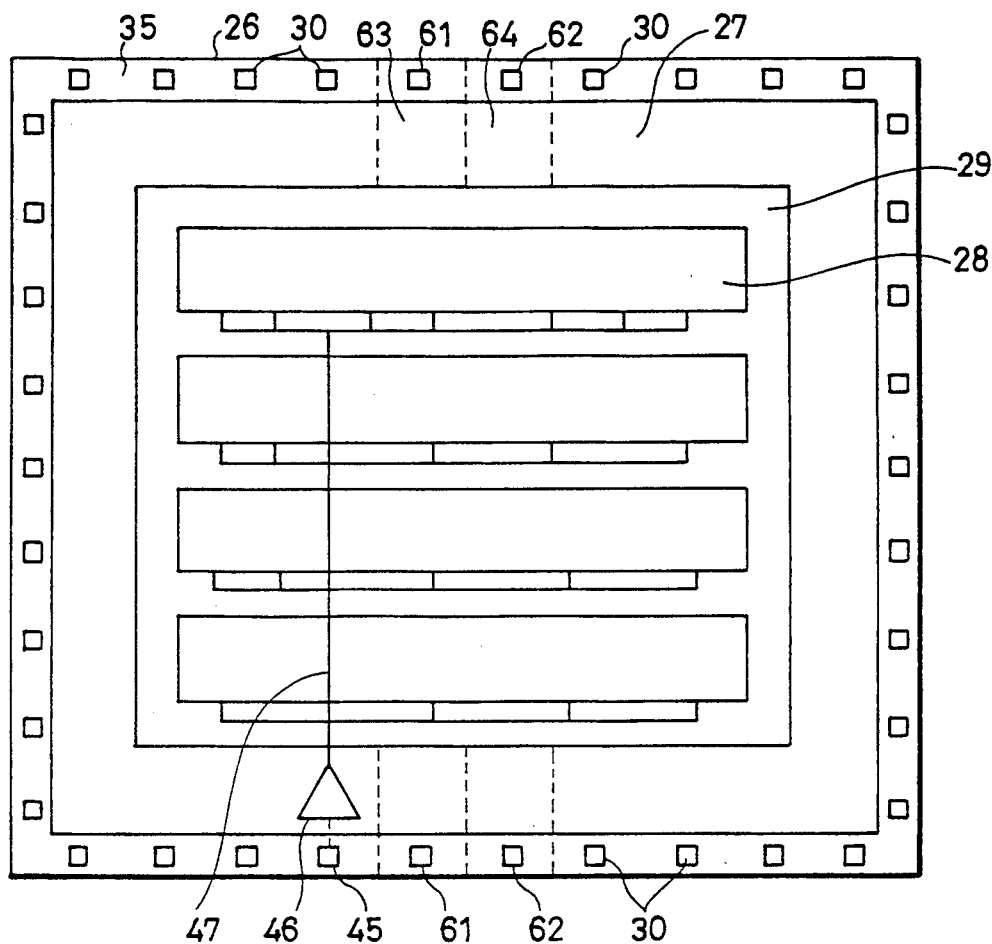
FIG. 13 is a plan view of a conventional semiconductor integrated circuit device.
Figure 14:
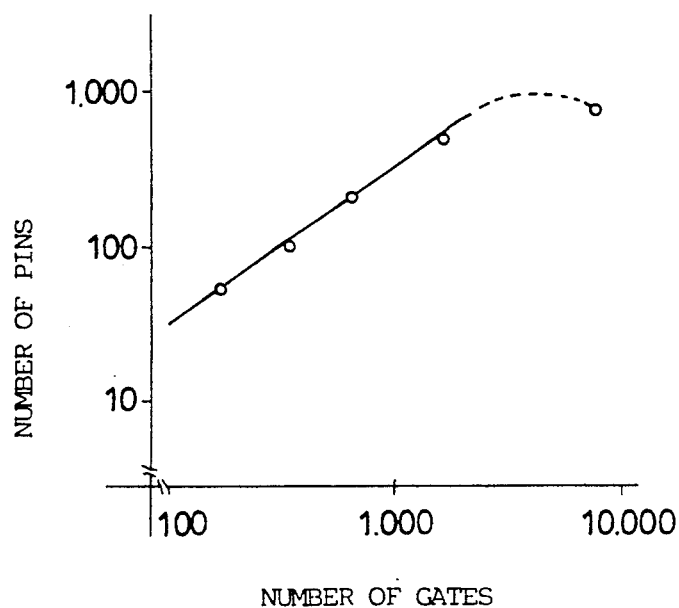
FIG. 14 is a graph showing Rent's law.
Figure 15:
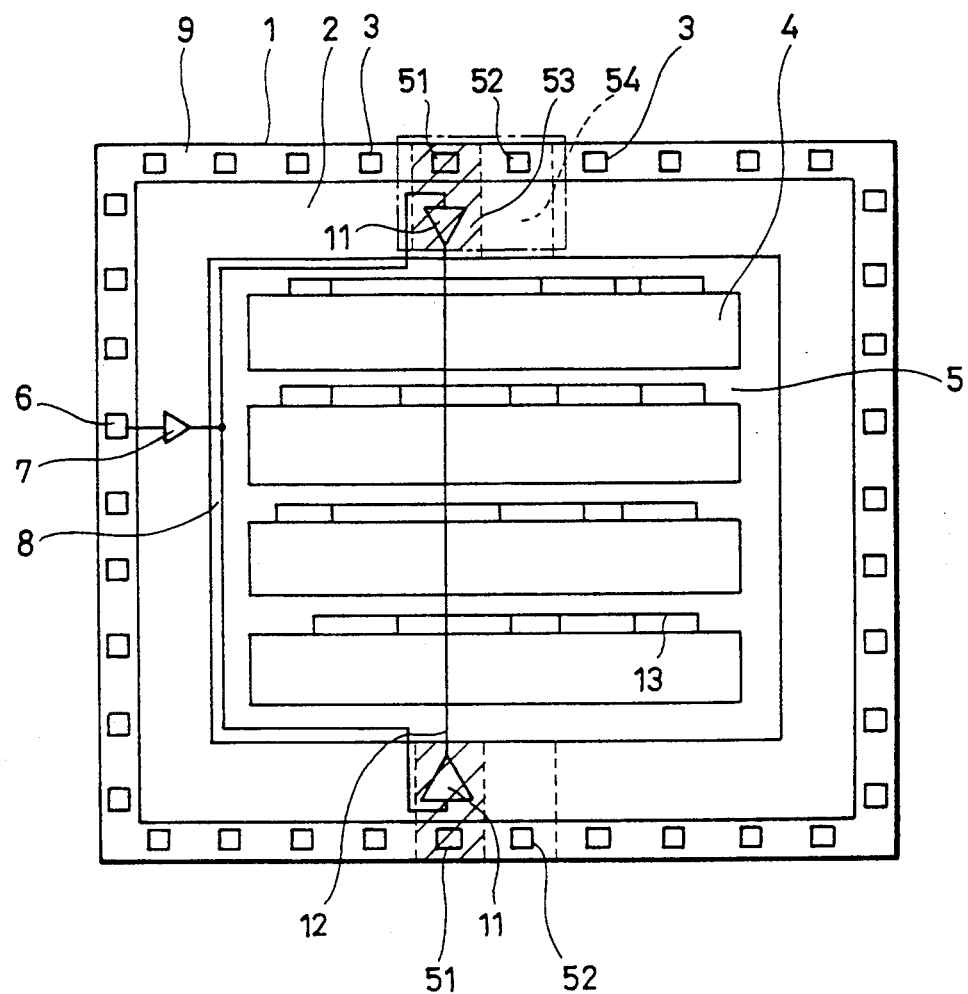
FIG. 15 is a plan view of a gate array semiconductor integrated circuit chip of one embodiment of the present invention.

FIG. 15 is a plan view of a gate array chip in accordance with one embodiment of the present invention. Referring to FIG. 15, the main surface of this gate array chip 1 is divided into basic cell columns 4, a signal interconnection region 5 in which interconnection required for personalization is effected later to the basic cell columns 4, a pad forming region 9 along the outer periphery of the chip 1 on which a bonding pad for connecting the chip 1 with the external circuitry is formed, and an input-output buffer region on which an input-output buffer circuit is formed for effecting input-output buffer between the pad forming region 9 and the signal interconnection region 5.

In the pad forming region 9, there are formed are a pair of power supply pads 51 in the corresponding positions on two sides facing each other in the chip 1, a pair of ground pads 52 provided respectively in the two sides facing each other in the chip 1, adjoining the power supply pads 51 and opposing each other, a clock signal input pad 6 to which a clock signal is externally applied, and a plurality of bonding pads 3 formed on the pad forming region 9, spaced apart with a specific distance from the adjoining power supply pads 51, the ground pads 52, the clock signal input pad 6 or other bonding pads 3.

A region 53 surrounding the pad forming region 9 where the power supply pads 51 are formed and the input-output buffer region 2 adjoining the power supply pads 51 is called a power supply pin region. The region 54 surrounding the portion of the pad forming region 9 where the ground pads 52 are formed and the input-output buffer region 2 adjoining the ground pads 52 is called a ground pin region.

In the input-output buffer region 2, there are formed a clock signal input buffer 7 adjoining the clock signal input pad 6 for buffering a clock signal supplied from the pad 6, and a pair of clock signal drivers 11 formed on the power supply pin regions 53 facing each other, and having the inputs connected to the clock signal input buffer 7 through a clock signal interconnection 8. The outputs of the pair of clock signal drivers 11 are connected to each other through a main clock interconnection 12. The main clock signal interconnection 12 is connected to basic cells included in each basic cell column 4 over the clock signal interconnection 13.

Figure 16:
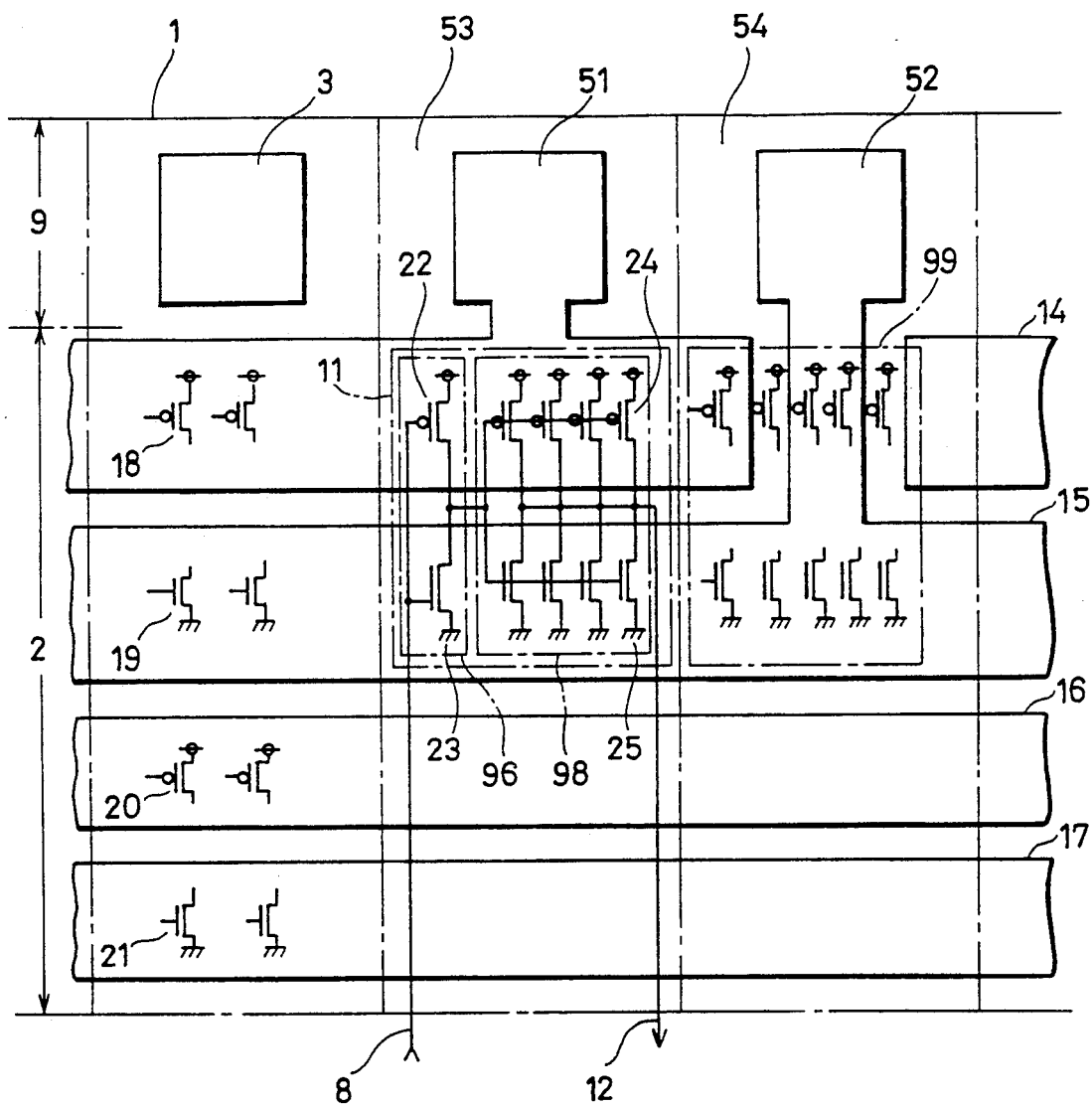
FIG. 16 is an enlarged view of a part of FIG. 15.

FIG. 16 is an enlarged view of the region 65 including the power supply pin region 53 and the ground pin region 54 in FIG. 15. Referring to FIG. 16, in the input-output region 2, there are formed a power supply interconnection for output buffer 14, a ground interconnection for output buffer 15, a power supply interconnection 16 for input buffer and prebuffer, and a ground interconnection 17 for input buffer and prebuffer, formed in this order from the pad forming region 9 to the inner side of the chip. The interconnection 14 is connected to the power supply pad 51 in the power supply pin region 53. The ground interconnection 15 is connected to the ground pad 52 in the ground pin region 54.

A clock driver 11 is also formed in the lower portion of the power supply interconnection for output buffer 14 and the ground interconnection for output buffer 15 in the power supply pin region 53. The clock driver 11 includes a predriver 96 having the input connected to the clock signal interconnection 8, and a main clock driver 98 having the input connected to the output of the predriver 96, and the output connected to the main clock signal interconnection 12.

The predriver 96 includes a pMOS transistor 22 formed under the power supply interconnection 14 for output buffer, having the source connected to the power supply interconnection 14 for output buffer, the gate connected to the clock signal interconnection 8 and the drain connected to the input of the main driver 98, and an nMOS transistor 23 formed under the ground interconnection for output buffer 15, having the source connected to the ground interconnection for output buffer 15, the gate connected to the clock signal interconnection 8, and the drain connected to the input of the main driver 98.

The main driver 98 includes a plurality of pMOS transistors 24 formed in the lower portion of the power supply interconnection for output buffer 14, having the sources connected to the power supply interconnection for output buffer 14, respectively, the gates connected to the output of the predriver 96, and the drain connected to the main clock signal interconnection 12, and a plurality of nMOS transistors 25 formed under the ground interconnection for output buffer 15, having the respective sources connected to the ground interconnection for output buffer 15, the gates connected to the output of the predriver 96, and the drains connected to the main clock interconnection 12.

In the lower portion of the power supply interconnection for output buffer 14 and the ground interconnection for output buffer 15 in the ground pin region 54, there is formed an embedded element 99 in the ground pin region, allowing constitution of a circuit similar to the clock signal driver 11. The element 99 embedded in the ground pin region, as well as the clock signal driver 11, includes a plurality of pMOS transistors formed under the power supply interconnection for output buffer 14 and a plurality of nMOS transistors formed under the ground interconnection for output buffer 15.

A transistor for forming an input-output buffer is embedded in the input-output buffer region 2 except the power supply pin region 53 and the ground pin region 54. Referring to FIG. 16, a pMOS transistor 18 for forming an output buffer is formed under the power supply interconnection for output buffer 14. An nMOS transistor 19 for forming an output buffer is formed under the ground interconnection for output buffer 15. A pMOS transistor 20 for forming an input buffer is formed under the power supply interconnection for input buffer 16. An nMOS transistor 21 for input buffer and prebuffer is formed under the ground interconnection for input buffer and prebuffer 17.

The gate array chip shown in FIGS. 15 and 16 operates as follows. A clock signal externally supplied to the clock signal input pad 6 is applied on the clock signal interconnection 8 after being temporarily buffered by the clock signal input buffer 7. The clock signal is applied to the clock signal driver 11. The clock signal driver 11 supplies the clock signal to the main clock signal interconnection 12 with a sufficient drive capability. The clock signal supplied on the main clock signal interconnection 12 is applied to the basic cells in each basic cell column over the clock signal interconnection 13.

Each basic cell in the basic cell columns 4 is provided with data supplied from the bonding pad 3 and buffered by the input buffer in the input-output buffer region 2. Each basic cell operates based on the supplied information, synchronizing with the clock signal applied from the clock signal driver 11, and provides the result to the output buffers formed in the input-output buffer region 2. Each output buffer provides the supplied information to the outside over the bonding pad 3.

As stated above, in the gate array chip 1 according to the invention, the pMOS transistors 22, 24 and the nMOS transistors 23, 25 for clock signal driver are buried in advance under the power supply interconnection for output buffer 14 and the ground interconnection for output buffer 15 in the power supply pin region 53 and the ground pin region 54. Each of these transistors is connected through interconnection in a first layer among the interconnections in a plurality of layers within the gate array chip 1, forming the clock signal driver 11.

Conventionally, both of the power supply pin region 53 and the ground pin region 54 were not utilized effectively. Compared with such a conventional gate array chip, in the gate array chip in accordance with the invention, it is possible to provide the clock signal driver 11 in the power supply pin region 53 and the ground pin region 54. There is enough space in the power supply pin region 53 and the ground pin region 54. The clock signal driver 11 may be large enough to collectively drive flipflops included in each basic cell column in the gate array chip 1.

As shown in FIG. 15, two clock signal drivers 11 may be arranged in the power supply pin regions 53 adjoining the power supply pads 51 provided on two sides facing each other in the gate array chip 1. The outputs of the two clock signal drivers 11 are connected by the main clock signal interconnection 12. A clock signal is provided to each flipflop over the clock signal interconnection 13 branching from the main clock signal interconnection 12. Each flipflop can be thereby provided with a clock signal which have less skews, and are immune to noises.

Figure 17:
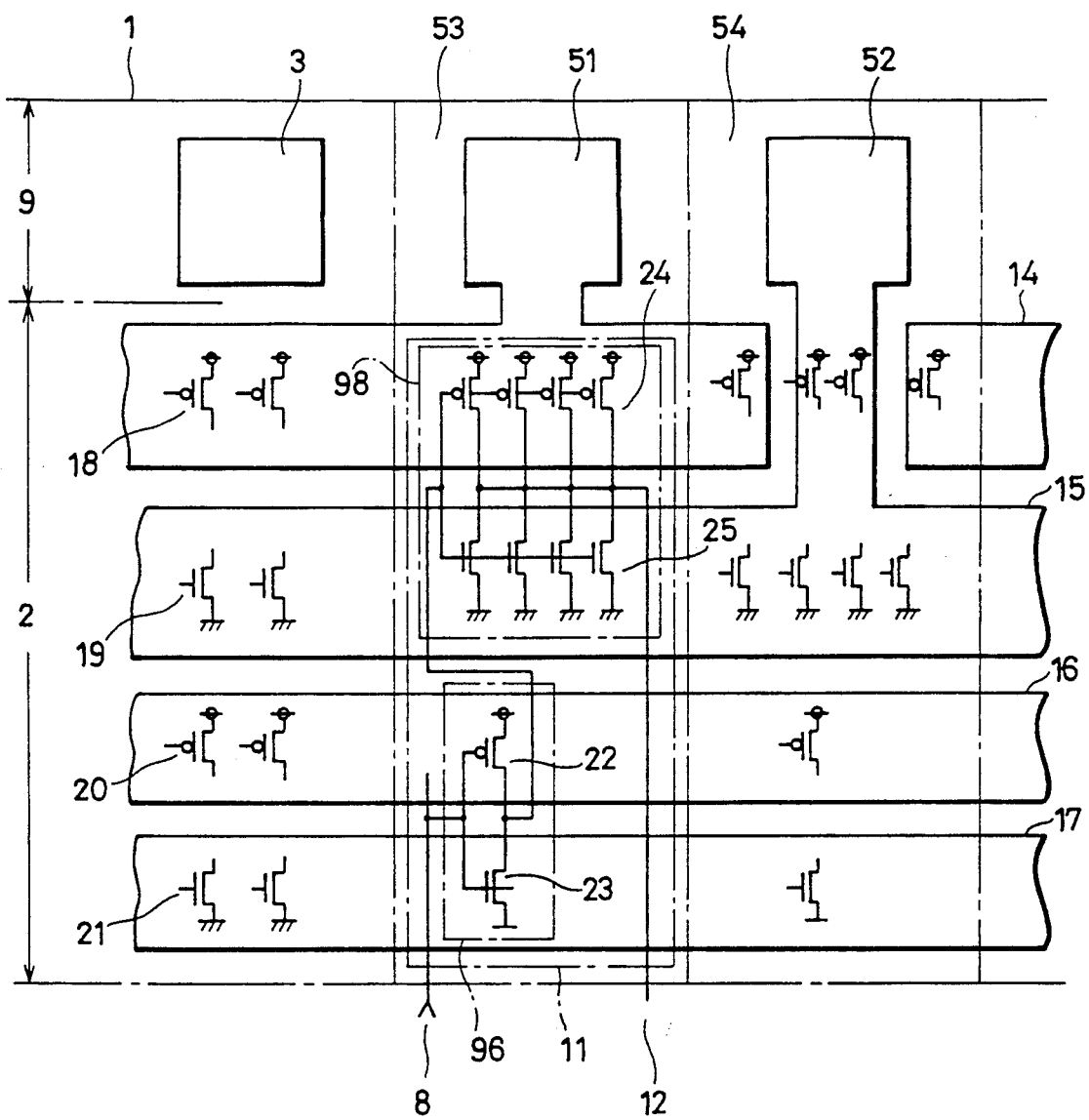
FIG. 17 is an enlarged view of a part of a gate array semiconductor integrated circuit device of a second embodiment of the present invention.

FIG. 17 is an enlarged view of the power supply pin region 53 and the ground pin region 54 in another embodiment of the gate array chip in accordance with the present invention. The plan view of the entire gate array chip in accordance with this second embodiment is the same as that shown in FIG. 15. Accordingly, a description will now be made as to this embodiment with reference to FIG. 17 only.

The gate array chip shown in FIG. 17 is different from the gate array chip shown in FIG. 16 in that the predriver 96, which is formed under the power supply interconnection for output buffer 14 and the ground interconnection for output buffer 15 in the first embodiment, is formed under the power supply interconnection for input buffer and prebuffer 16 and the ground interconnection for input buffer and prebuffer 17 in the second embodiment. In FIGS. 16 and 17, the same or corresponding portions are given the same reference numerals and names. Their functions are also the same. Accordingly, a detailed description thereof is not repeated here.

Referring to FIG. 17, the clock signal driver 11 includes a predriver 96, and a main driver 98 formed under the power supply interconnection for output buffer 14 and the ground interconnection for output buffer 15. The main driver 98 has the same structure as that of the main driver 98 in the first embodiment shown in FIG. 16.

The predriver 96 includes a pMOS transistor 22 formed under the power supply interconnection for input buffer and prebuffer 16, having the respective sources connected to the interconnection 16, the respective gates connected to the clock signal interconnection 8 and the respective drains connected to the input of the main driver 98, and an nMOS transistor 23 formed under the ground interconnection for input buffer and prebuffer 17, having the respective sources connected to the interconnection 17, the respective gates connected to the clock signal interconnection 8, and the respective drains connected to the input of the main driver 98.

The operations of the gate array chip 1 shown in FIG. 17 and the gate array chip 1 shown in FIG. 16 are the same. Accordingly, a detailed description thereof is not repeated here. The characteristic of the gate array chip in accordance with the second embodiment shown in FIG. 17 is that it has effects below in addition to the effects of the gate array chip in accordance with the first embodiment.

In the second embodiment, the predriver 96 receives the power to operate from the power supply interconnection for input buffer and prebuffer 16, and the main driver 98 receives the power from the power supply interconnection for output buffer 14. In departure from the gate array chip shown in FIG. 16, the load on the power supply may be dispersed.

The whole power supply pin region 53 may be utilized effectively as a region for forming a clock signal driver 11. Therefore, the main driver 98 can be made larger and the drive capability of the clock signal driver can be increased. Accordingly, it is possible to provide a clock signal having effectively reduced skews to each flipflop even if the number of flipflops in the gate array is increased.

A description as to the gate array chips in accordance with the invention has been made with respect to two embodiments. The invention, however, is not limited to these. For example, in the above-mentioned embodiments, the clock signal driver is formed only in the power supply pin region. The clock signal driver, however, may be arranged in the ground pin region. In the gate array chips shown in FIGS. 16 and 17, no transistors arranged in the ground pin region 54 for forming a clock signal driver are utilized. Input-output buffer circuits, however, may be formed using these transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    a semiconductor substrate having a main surface, said main surface being divided into a central region in the central portion, a peripheral region along the outer periphery of said semiconductor substrate, and an intermediate region between said central region and said peripheral region;
    a basic cell array including a plurality of basic cells formed on said main surface in said central region, each said basic cell including a plurality of active elements and for forming a logic circuit;
    a plurality of bonding pads provided in said peripheral region and having a power supply pad and an input/output pad; and
    a clock signal driving means for providing a clock signal to said logic circuit, said clock driving means being formed in said intermediate region between said power supply pad and an outer edge of said central region, and positioned immediately adjacent said power supply pad.

2. A semiconductor integrated circuit device according to claim 1, further comprising a power supply layer electrically connected to said power supply pad and formed over and covering a portion of said clock signal driving means.

3. A semiconductor integrated circuit device comprising:
    a semiconductor substrate having a main surface,
    said main surface being divided into a first region in the central portion, a second region along the outer periphery of said semiconductor substrate, and a third region between said first region and said second region, said third region circumscribing said first region and said second region circumscribing said third region;
    a basic cell array including a plurality of basic cells formed on said main surface in said first region,
    each said basic cell including a plurality of active elements;
    a plurality of wire bonding pads provided in said second region, and sued for connecting said semiconductor integrated
    a power bus formed in said third region and connected to a power supply wire bonding pad formed in said second region for supplying an externally potential to said basic cell array;
    a clock signal driving means formed in said third region immediately adjacent one power supply wire bonding pad, said clock signal driving means providing a clock signal externally applied over a clock signal input pad to each of said basic cells; and
    a plurality of input-output interface means formed in said third region for interfacing said basic cell array and the outside,
    each input/output interface means including output buffer means for supplying one of the outputs of said basic cell array to the outside over one of said plurality of wire bonding pads, and input buffer means for supplying a signal externally applied over a wire bonding pad to said basic cell array; wherein
    said powerbus is stacked on said clock signal driving means and the input-output interface means, provides predetermined voltage to said input-output interface means and includes an interconnection connected respectively to said power supply wire bonding pad in a portion of said third region which is above said clock signal driving means for providing an externally applied voltage over said power supply wire bonding pad to said output buffer means.

4. A semiconductor integrated circuit device comprising:
    a semiconductor substrate having a main surface,
    said main surface being divided into a central region in the central portion, a peripheral region along the outer periphery of said semiconductor substrate, and an intermediate region between said central region and said peripheral region;

a basic cell array including a plurality of basic cells formed on said main surface in said central region, each said basic cell including a plurality of active elements;

a plurality of bonding pads provided in said peripheral region, and used for connecting said semiconductor integrated circuit device with the outside, said plurality of bonding pads including input/output bonding pads for receiving and supplying signals and a power supply bonding pad means for receiving a power supply voltage, said power supply bonding pad means including a plurality of power supply bonding pads, a clock signal driving means formed in said intermediate region immediately adjacent one power supply bonding pad, said clock signal driving means providing an externally supplied clock signal to each of said basic cells;

a plurality of input-output interface means formed in said intermediate region and connected to said input/output pads for interfacing said basic cell array and external signal lines, each input-output interface means including output buffer means for supplying outputs of said basic cell array over said input/output pads, and input buffer means for supplying an external signal from said input/output pads to said basic cell array; and interconnection means formed in said intermediate region, for providing said power supply voltage to said input-output interface means.

5. The semiconductor integrated circuit device according to claim 4 further comprising:

clock signal buffer means formed in said intermediate region, adjoining a clock signal input pad in said peripheral region for buffering and supplying said externally supplied clock signal over said clock signal input pad, the input of said clock signal driving means being connected to the output of said clock signal buffer means; and second clock signal driving means formed in said intermediate region immediately adjacent another power supply bonding pad means provided in said peripheral region and also connected to the output of said clock signal buffer means, said second clock signal driving means providing said externally supplied clock signal supplied over said clock signal input pad to each of said basic cells.

6. The semiconductor integrated circuit device according to claim 5, further comprising means for connecting the output of said clock signal driving means with the output of said second clock signal driving means.

7. The semiconductor integrated circuit device according to claim 6, wherein said interconnection means includes a first pair of interconnections positioned above said clock signal driving means and connected respectively to said power supply bonding pad means for providing externally applied voltages to said output buffer means.

8. The semiconductor integrated circuit device according to claim 7, wherein said interconnection means further includes a second pair of interconnections positioned above said second clock signal driving means and connected respectively to said another power supply bonding pads means for providing predetermined externally applied voltages to said input buffer means.

9. The semiconductor integrated circuit device according to claim 8, wherein said clock signal driving means comprises:

a predriver provided in a portion of said intermediated region which is under said second pair of interconnections for receiving the power from said second pair of interconnections and inverting said clock signal applied from said clock signal buffer means; and a main driving provided in a portion of said intermediate region which is under said first pair of interconnections for receiving the power from said first pair of interconnections, and providing said clock signal inverted by said predriver to a basic cell column with a sufficient drive capability as well as inverting the same again.

10. The semiconductor integrated circuit device according to claim 9, wherein said power supply pad means provided a Vdd and a GND potential.

11. The semiconductor integrated circuit device according to claim 4, wherein said power supply bonding pad means comprises adjoining power supply bonding pads.

12. The semiconductor integrated circuit device according to claim 4, wherein said intermediate region includes other active elements, and further comprising second interconnection means for connecting active elements with each other in order to form said clock signal driving means, said second interconnection means being formed in the lowest layer among the interconnections included in said semiconductor integrated circuit device.

13. The semiconductor integrated circuit device according to claim 4, wherein each said basic cell comprises an active element of a predetermined first conductivity type, and an active element of a second conductivity type different from said first conductivity type.

14. The semiconductor integrated circuit device according to claim 13, wherein said active element included in each of said basic cells comprises the same number of said active elements of first conductivity type and said active elements of second conductivity type.

15. The semiconductor integrated circuit device according to claim 14, wherein each of said basic cells comprises a plurality of said active elements of first conductivity type.

16. A semiconductor integrated circuit device comprising:

a semiconductor substrate having a main surface, said main surface being divided into a central region in the central portion, a peripheral region along the outer periphery of said semiconductor substrate, and an intermediate region between said central region and said peripheral region;

a basic cell array including a plurality of basic cells formed on said main surface in said central region, each said basic cell including a plurality of active elements;

a plurality of bonding pads provided in said peripheral region, and used for connecting said semiconductor integrated circuit device with the outside, said bonding pads including input/output bonding pads for receiving and supplying signals and a power supply bonding pad for receiving a clock power supply voltage, a clock signal driving means formed in said intermediate region immediately adjacent said power supply bonding pad, said clock signal driving means providing an externally supplied clock signal to each of said basic cells;

a plurality of input-output interface means formed in said intermediate region and connected to said input/output pads for interfacing said basic cell array and external signal lines, each interface means including output buffer means for supplying outputs of said basic cell array over said input/output pads, and input buffer means for supplying an external signal from said input/output pads to said basic cell array; and interconnection means formed in said intermediate region, for providing said power supply voltage to said input-output interface means.

17. The semiconductor integrated circuit device according to claim 16, wherein said power supply bonding pad provides a Vdd potential.

18. The semiconductor integrated circuit device according to claim 16, wherein said power supply pad bonding means provides a GND potential.

19. The semiconductor integrated circuit device according to claim 16, further comprising means for connecting the output of said clock signal driving means with an output of a second clock signal driving means.

20. The semiconductor integrated circuit device according to claim 16, wherein said intermediate region includes other active elements, and further comprising second interconnection means for connecting active elements with each other in order to form said clock signal driving means, said second interconnection means being formed in the lowest layer among the interconnections included in said semiconductor integrated circuit device.

21. The semiconductor integrated circuit device according to claim 16, wherein each said basic cell comprises an active element of a predetermined first conductivity type, and an active element of a second conductivity type different from said first conductivity type.

22. The semiconductor integrated circuit device according to claim 16, wherein said active element included in each of said basic cells comprises the same number of said active elements of first conductivity type and said active elements of second conductivity type.

23. The semiconductor integrated circuit device according to claim 16, wherein each of said basic cells comprises a plurality of said active elements of first conductivity type.

* * * * *